United States Patent
Lou et al.

[11] Patent Number: 6,079,355
[45] Date of Patent: Jun. 27, 2000

[54] ALIGNMENT AID FOR AN ELECTRODE PLATE ASSEMBLY

[75] Inventors: Chang Ping Lou, Taipei; James Ho, Hsinchu, both of Taiwan

[73] Assignee: United Microelectronics Corp., Taiwan

[21] Appl. No.: 08/839,632

[22] Filed: Apr. 15, 1997

[30] Foreign Application Priority Data

Feb. 11, 1997 [TW] Taiwan ................................. 8602305

[51] Int. Cl.[7] ................................................. C23C 15/00
[52] U.S. Cl. ....................................... 118/723 E; 156/345
[58] Field of Search ........................ 118/723 E; 156/345

[56] References Cited

U.S. PATENT DOCUMENTS

| | | | |
|---|---|---|---|
| 4,367,114 | 1/1983 | Steinberg et al. | 156/345 |
| 4,810,322 | 3/1989 | Gut et al. | 156/345 |
| 5,324,411 | 6/1994 | Ichishima et al. | 156/345 |
| 5,556,474 | 9/1996 | Otani et al. | 118/723 E |
| 5,698,035 | 12/1997 | Matsudo et al. | 118/723 E |
| 5,846,329 | 12/1998 | Hori et al. | 118/723 E |

*Primary Examiner*—R. Bruce Breneman
*Attorney, Agent, or Firm*—Finnegan, Henderson, Farabow, Garrett & Dunner, L.L.P.

[57] ABSTRACT

An electrode plate assembly for installation to an etching console includes a cooling electrode plate, an aligning peg, a covering plate and a plurality of screws for coupling the electrode cooling plate and cover plate. The cooling electrode plate is formed of a metallic, disk-shaped electrode plate including an aligning peg securing hole, a plurality of first screw holes and a plurality of first vent holes. The aligning peg is located within the aligning peg securing hole and protrudes from the cooling electrode plate. The covering plate is a thin disk-shaped plate including an aligning peg receiving hole, a plurality of second screw holes and a plurality of second vent holes. Upon installation, the covering plate and the cooling electrode plate are coupled by a plurality of screws through the first and second screw holes, with the aligning peg received in the aligning peg receiving hole of the covering plate to assure proper alignment of the plates.

10 Claims, 2 Drawing Sheets

ALIGNMENT AID FOR AN ELECTRODE PLATE ASSEMBLY

BACKGROUND OF THE INVENTION

1. Field of the Invention

The present invention relates to an apparatus for use in semiconductor processing, more particularly to an alignment aid for an electrode plate assembly utilized in the film etching process.

2. Description of Related Art

Wet and dry etching are currently the most common techniques used in semiconductor processing. The dry etching technique utilizes a plasma to perform film etching, as compared to the wet etching technique which uses a solution to carry out the etching. One of the major benefits of dry etching is that it can perform what is termed "anisotropic etching." Based upon the particles generated by plasma, the etching rate in a vertical direction is much greater and more accurate than in a horizontal direction. When a voltage is applied to accelerate charged ions of the generated plasma, ion bombardment takes place which results in film etching. This technique, which utilizes momentum transfer to perform the etching, is termed "sputtering etch."

A second type of dry etching is know as "plasma etching." Plasma etching uses plasma to decompose reactive gas molecules into ions which react on the film being etched. The chemical reaction of the reactive ions produces the intended etching. Like the above mentioned wet etching, this type of dry etching relies upon a chemical reaction and therefore provides greater selectivity but less anisotropy. In order to realize a dry etching technique with greater selectivity and higher anisotropy, reactive ion etch (RIE) has been developed and has become a popular technique in semiconductor etching.

The above mentioned dry etching techniques use a plasma generator to create the plasma necessary to perform the intended etching. Plasma contains gas molecules in a breakdown state and functions as a conductor for transferring currents. The generation of plasma is completed by applying voltage through a top electrode plate and a bottom electrode plate.

A portion of a conventional electrode plate for installation to an etching console is shown in FIG. 1. The electrode plate includes a cooling electrode plate 10, a covering plate 120 and a plurality of screws (not shown).

The cooling electrode plate 110 is a substantially disk-shaped metallic plate having a plurality of screw holes 114, and a plurality of vent holes 116. The covering plate 120 is a thin, substantially disk-shaped plate also having a plurality of screw holes 124 and a plurality of vent holes 126. The vent holes of the plates 110, 120 may be round in shape, for example. Each of the vent holes 116 of the cooling plate correspond in size and position with the vent holes 126 of the cover plate. When the cooling electrode plate 110 and the covering plate 120 are coupled correctly, the vent holes 116 of the cooling plate will align and communicate with the vent holes 126 of the cover plate.

The installation of the electrode plate requires aligning the screw holes 114 of the cooling electrode plate with the screw holes of the covering plate 120 and then screwing the plates together to an etching console (not shown).

Since the above method of installation does not assure alignment of the vent holes, misalignment of the vent holes can occur and result in abnormal etching or expensive delays in the manufacturing process.

SUMMARY OF THE INVENTION

Accordingly, an object of the present invention is to create an electrode plate assembly which obviates the vent hole misalignment problems associated with the installation of conventional electrode plates.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises an electrode plate assembly including a cooling electrode plate having an aligning member protruding therefrom, and a covering plate for coupling with the cooling electrode, wherein the aligning member is engaged with the covering plate to aid in the proper alignment of the plates upon installation to an etching console.

In accordance with another aspect, the present invention comprises a substantially disk-shaped metallic cooling electrode plate having an aligning peg securing hole, a plurality of first screw holes, and a plurality of first vent holes. An aligning peg is positioned inside the aligning peg securing hole and protruding from an end surface of the cooling electrode plate. A cooling electrode plate further includes a thin, substantially disk-shaped covering plate having an aligning peg receiving hole, a plurality of second screw holes and a plurality of second vent holes. During installation of the plates to an etching console the protruding portion of the aligning peg is located within the aligning peg receiving hole of the covering plate to assure the proper alignment of the screw and vent holes of the respective plates. Thereafter, the covering plate and the cooling electrode plate are easily coupled by a plurality of screws through the first and second screw holes and into the etching console.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principals of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 2:
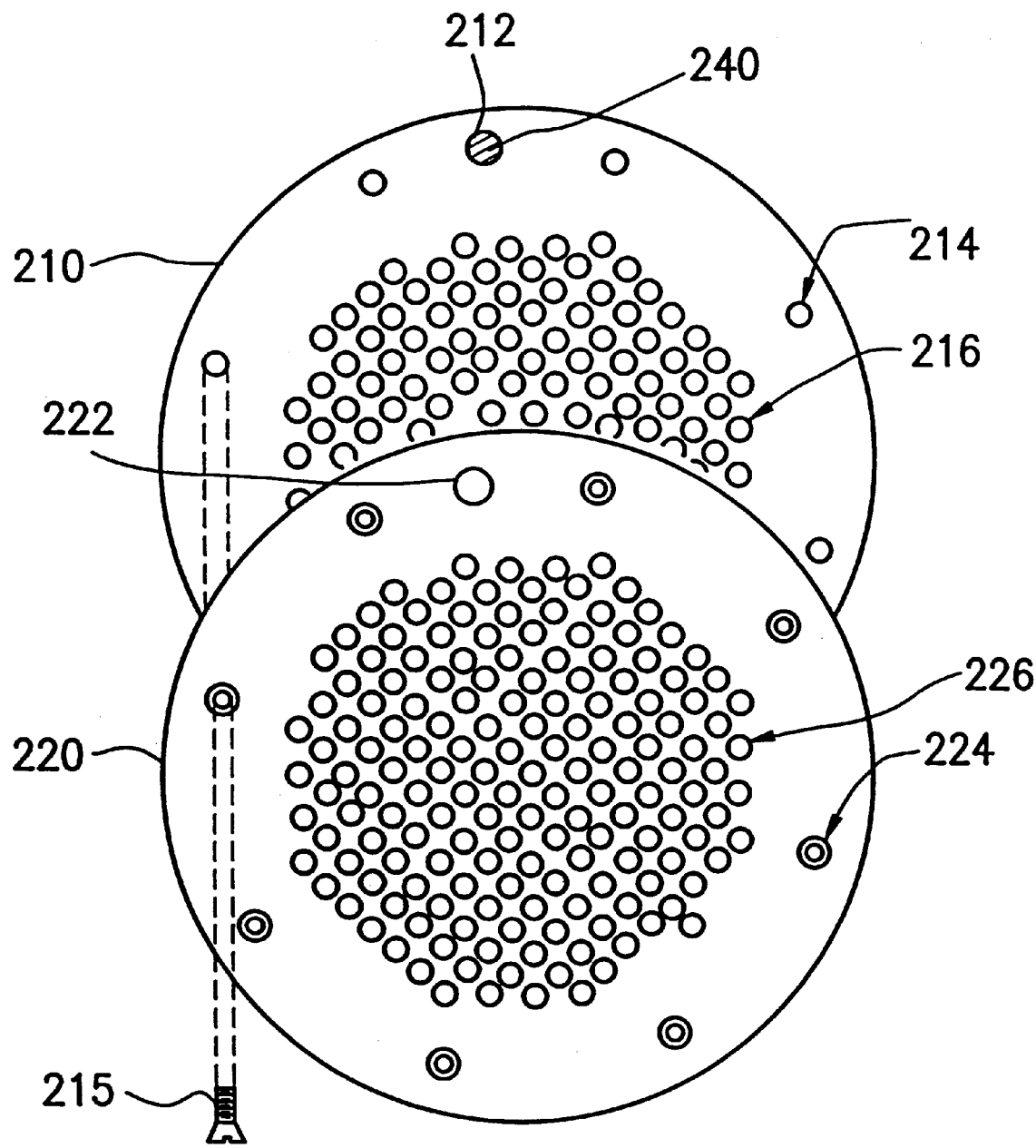
FIG. 2 is a schematic diagram illustrating the preferred embodiment of an electrode plate assembly in an aligned position according to the present invention.

FIG. 2 is a schematic diagram illustrating the preferred embodiment of an electrode plate assembly in an aligned installation position according to the present invention. The electrode plate assembly, which is installed on an etching console (not shown), includes a cooling electrode plate 210, an aligning member 240, and a covering plate 220. The aligning member 240 is, for example, a cylindrical peg.

The cooling electrode plate 210 is a substantially disk-shaped metallic electrode plate with an aligning member securing hole 212, a plurality of first screw holes 214, and a plurality of first vent holes 216. The aligning member securing hole 212 and first vent holes 216 may be round in shape, for example. The covering plate 220 is a thin, substantially disk-shaped plate having an aligning member receiving hole 222, a plurality of second screw holes 224, and a plurality of second vent holes 226. The aligning member receiving hole 222 and second vent holes 224 may also be round in shape, for example. Each of the first vent holes 216 correspond in position and size with an appropriate vent hole of the plurality of second vent holes 226. When the cooling electrode plate 210 and the covering plate 220 are coupled correctly the first vent holes 216 will align and communicate with the second vent holes 226.

When the aligning member 240 is a cylindrical aligning peg, the diameter of the aligning peg is only slightly less than the diameter of the securing hole 212 of the cooling electrode plate 210. The slightly smaller diameter of the aligning peg 240 allows the peg to be located securely within the securing hole 212. The depth of the securing hole 212 is less than the axial length of the aligning peg 240 which results in the peg protruding from an end surface of the cooling electrode plate 210. Proper alignment of the cooling electrode plate 210 and the covering plate 220 is assured by locating the aligning peg 240 within the receiving hole 222. Therefore, when the aligning peg 240 is positioned within the receiving hole 222 the first and second vent holes will be aligned. The resulting alignment of the cooling electrode plate 210 and covering plate 220 will prevent any abnormal etching due to misalignment of the first and second vent holes 216, 226.

The installation of the electrode plate assembly of FIG. 2 to an etching console (not shown) therefore requires first mating the aligning peg 240 protruding from the cooling electrode plate 210 with the receiving hole 222 of the covering plate 220, and second, inserting screws 215 through the associated first and second screw holes 214 and 224 of the plates 210, 220 and into an etching console (not shown).

Figure 1:
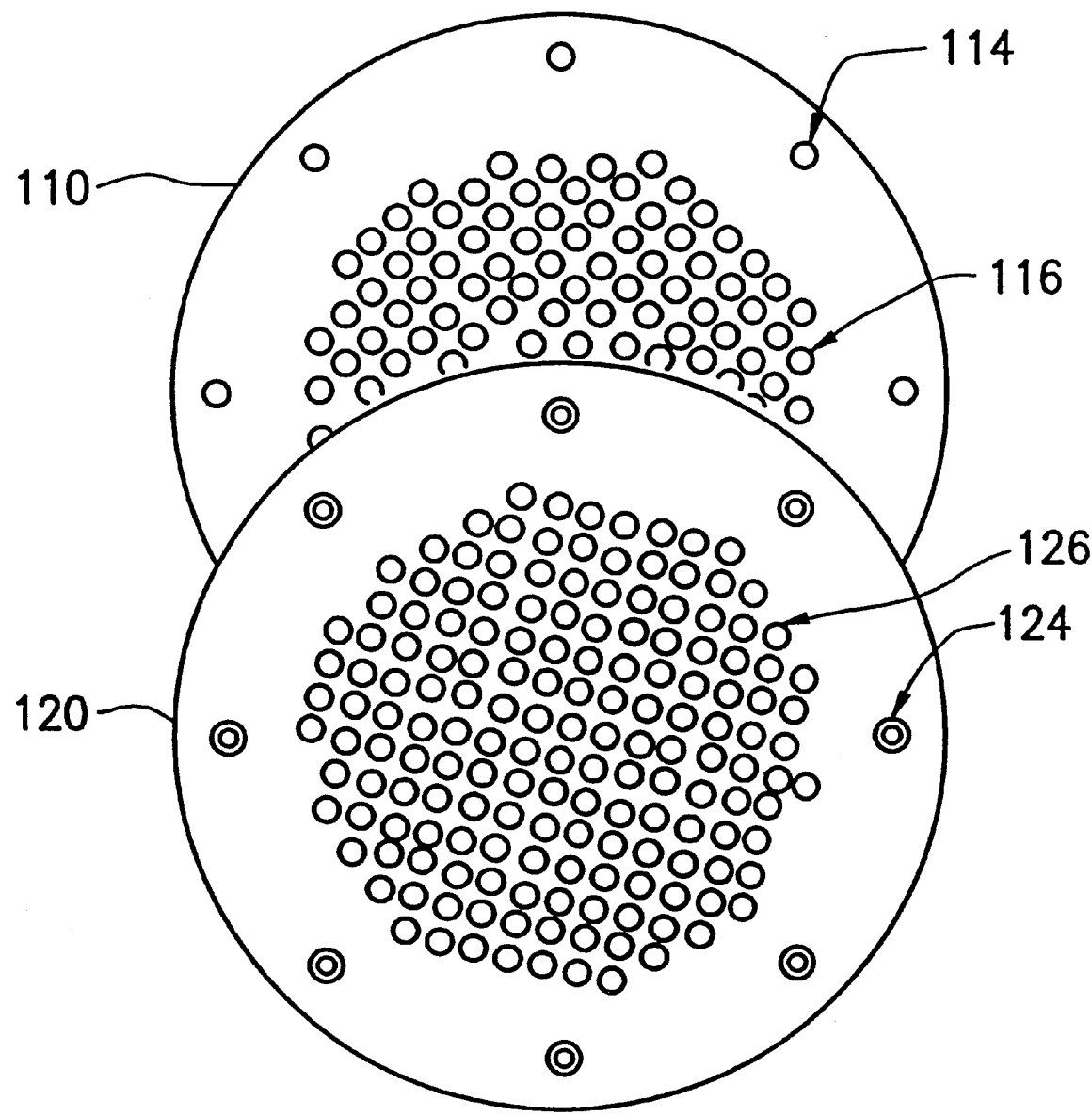
FIG. 1 is a schematic diagram illustrating a portion of a conventional electrode plate assembly in a non-aligned position.

Comparing FIG. 1 with FIG. 2, it is clear that the conventional electrode plate assembly is easily installed improperly if the rotational position of the covering plate is incorrect in relation to the cooling electrode plate 210. However, according to the preferred embodiment of the present invention, the electrode plate assembly with aligning member 240 and receiving hole 222 assures the proper rotational position of the cover plate in relation to the cooling electrode plate 210 during installation of the plates to an etching console.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrode plate assembly for installation to an etching console, comprising:
    a substantially disk-shaped metallic cooling electrode plate having;
        a peg securing hole,
        a plurality of first screw holes, and
        a plurality of first vent holes;
    an aligning peg located partially within the peg securing hole and including a protruding portion extending from the cooling electrode plate; and
    a substantially disk-shaped covering plate having;
        a peg receiving hole for receiving the aligning peg protruding portion,
        a plurality of second screw holes, and
        a plurality of second vent holes; wherein
    a plurality of screws are inserted through the first and second screw holes to install the cooling electrode plate and covering plate.

2. An assembly according to claim 1, wherein, said first vent holes and said second vent holes are of equal size and number and define an inlet for etching gases.

3. An assembly according to claim 1, wherein said aligning peg received in the peg receiving hole aids in aligning said first vent holes and said second vent holes upon installation of said covering plate and said cooling electrode plate.

4. An electrode plate assembly for installation to an etching console, comprising:
    a cooling electrode plate having;
        a plurality of first screw holes, and
        a plurality of first vent holes;
    an aligning member protruding from the cooling electrode plate; and
    a covering plate having;
        a plurality of second screw holes, and
        a plurality of second vent holes; wherein
    the aligning member is engaged with the covering plate to aid in proper alignment of the first screw and vent holes with the second screw and vent holes.

5. The assembly according to claim 4, wherein the aligning member is a peg and said peg is located in a peg receiving hole of the cover plate upon installation.

6. An assembly according to claim 4, wherein, said first vent holes and said second vent holes are of equal size and number and define an inlet for etching gases.

7. An electrode plate assembly for installation to an etching console, comprising:
    a cooling electrode plate having an aligning member protruding therefrom; and
    a covering plate for coupling with the cooling electrode plate; wherein
    the aligning member is engaged with the covering plate to assure proper alignment of the plates upon installation.

8. The assembly according to claim 7, wherein the cooling electrode plate further includes a plurality of first screw holes, a plurality of first vent holes, and the cover plate includes a plurality of second screw holes, a plurality of second vent holes, and an aligning member receiving hole.

9. The assembly according to claim 8, wherein the aligning member is a peg and said peg is located in the aligning member receiving hole upon installation.

10. An assembly according to claim 8, wherein, said first vent holes and said second vent holes are of equal size and number and define an inlet for etching gases.

* * * * *